United States Patent
Savariego et al.

(10) Patent No.: US 12,538,421 B2
(45) Date of Patent: Jan. 27, 2026

(54) METHOD TO MULTI-SOURCE PD CONTROLLERS FOR USB4 SOLUTIONS AND SYSTEMS

(71) Applicant: Intel Corporation, Santa Clara, CA (US)

(72) Inventors: Tomer Savariego, Lavon (IL); Richard S. Perry, Portland, OR (US); Oren Huber, Nes Ammim (IL); Venkataramani Gopalakrishnan, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 646 days.

(21) Appl. No.: 17/894,032

(22) Filed: Aug. 23, 2022

(65) Prior Publication Data
US 2022/0408561 A1  Dec. 22, 2022

(51) Int. Cl.
*H05K 1/11* (2006.01)
*H01L 23/498* (2006.01)
*H05K 3/34* (2006.01)

(52) U.S. Cl.
CPC ........ *H05K 1/111* (2013.01); *H01L 23/49838* (2013.01); *H05K 3/3494* (2013.01); *H05K 2201/10378* (2013.01); *H05K 2201/10515* (2013.01); *H05K 2201/10719* (2013.01); *H05K 2201/10734* (2013.01)

(58) Field of Classification Search
CPC .............. H05K 1/111; H05K 1/141; H05K 2201/10378; H05K 2201/10515; H05K 2201/10719; H05K 2201/10734; H05K 3/3494; H01L 23/49838
See application file for complete search history.

(56) References Cited

U.S. PATENT DOCUMENTS

| | | | |
|---|---|---|---|
| 8,634,221 B2 * | 1/2014 | Thayer | G06F 3/0658 365/51 |
| 2014/0092572 A1 * | 4/2014 | Hossain | H05K 3/3436 361/767 |
| 2016/0029477 A1 * | 1/2016 | Iwanami | H05K 1/18 361/783 |
| 2022/0159860 A1 * | 5/2022 | Winzer | G02B 6/4278 |

* cited by examiner

*Primary Examiner* — Paresh Paghadal
(74) *Attorney, Agent, or Firm* — Compass IP Law PC

(57) ABSTRACT

A novel method and interface are provided to generalize power delivery (PD) solutions and allow OEMs and suppliers to easily replace PD solutions using the same design and layout without having to re-spin the motherboard. This is achieved by defining a new interface and ball-out which support dual port PD solution that meet the system requirements. The embodiments employ an interposer to unify different PD solutions. The interposer is part of a unique Land Grid Array (LGA) soldered down solution with pre-defined interface employing a generic pinout to support PD solutions for dual type-C ports from different vendors. The interposer includes an LGA having a pattern of pads that is coupled to a LGA on a platform PCB with a matching pattern.

20 Claims, 12 Drawing Sheets

METHOD TO MULTI-SOURCE PD CONTROLLERS FOR USB4 SOLUTIONS AND SYSTEMS

BACKGROUND INFORMATION

Devices and systems with USB4 (Universal Serial Bus 4) ports require PD (Power Delivery) controllers to properly manage their type-C ports in terms of data and power. A PD controller is used to determine provider and consumer power contracts that the port shall support and determine the data path and mode the connected device can support (e.g., USB4, Thunderbolt™ alternate mode, DisplayPort alt mode (DPAM), or other proprietary alt modes).

Each PD vendor defines its own solution with different levels of integration. For example, one PD vendor may integrate source path, while another may keep it externally. Generally, Each PD vendor uses different packages and pinouts, which makes their solution unique. Given the different level of integration in the PD chip and lack of standardized specification for the pinout, customers find it difficult to switch vendors quickly without having to re-spin (i.e., redesign) the printed circuit board (PCB, aka board) to which a vendor's PD package is coupled/mounted. This makes the selection between different PD solutions very hard for customers and once a solution has been chosen, there is no replacement (unless the board is re-spun). Global IC shortages are also causing OEMs to delay shipment of products due to the lack of an available validated PD solution that is compatible with their platform design(s).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
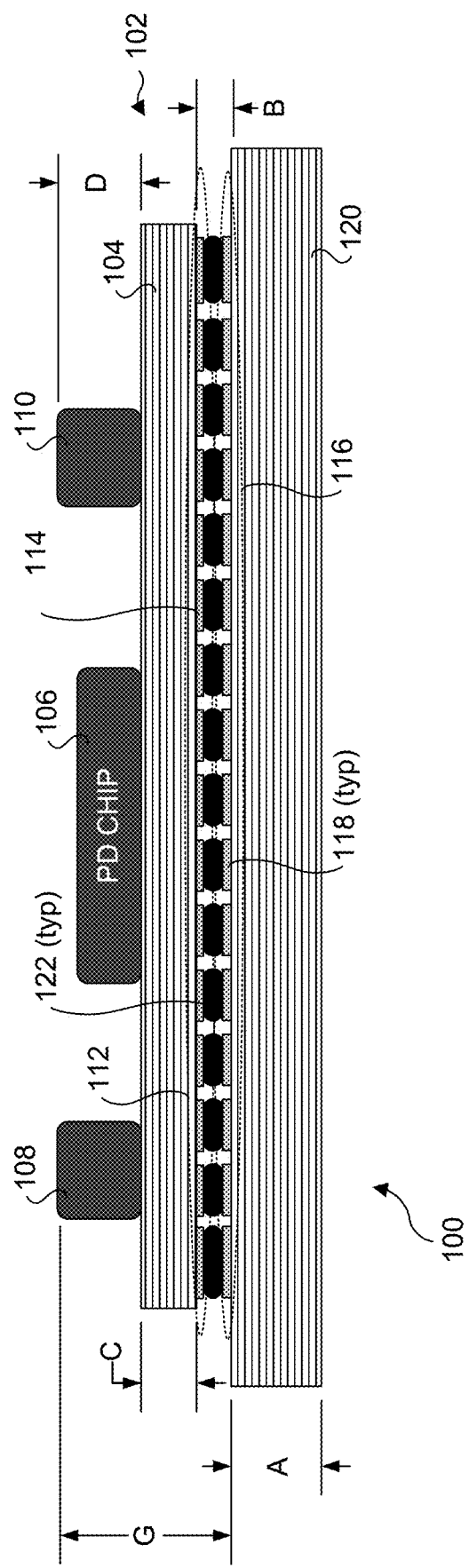
FIG. 1 shows a cross-section view of a system including a PD interposer comprising an embodiment of an LGA-soldered down solution having a pre-defined interface to support dual type-C ports.

Embodiments of methods and apparatus for multi-source PD controllers for USB4 solutions and are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiment described and illustrated herein, a novel method and interface are provided to generalize PD solutions and allow OEMs and suppliers to easily replace PD solutions using the same design and layout without having to re-spin the motherboard.

The embodiments employ an interposer to unify different PD solutions. The interposer is part of a unique Land Grid Array (LGA) soldered down solution with pre-defined interface employing a generic pinout to support dual type-C ports. The pre-defined interface provides all relevant interfaces from and towards the system to fully integrate it on the main PCB (e.g., motherboard or system board). Using the interface, manufacturers and suppliers can design several flavors of the interposers, each employing a different PD solution (pending on how many PD solutions they would like to support in their supply chain).

FIG. 1 shows cross-section view of a system 100 including a PD interposer 102 comprising an embodiment of an LGA-soldered down solution having a pre-defined interface to support dual type-C ports. PD interposer 102 comprises an interposer PCB 104 on which various PD circuitry is mounted, including a PD chip 106 and various circuit components such as resistors, capacitors, switches, etc., depicted by PD board components 108 and 110. An interposer PCB LGA 112 comprising a first plurality of interposer LGA pads 114 arranged in a first LGA pattern are disposed on the underside of interposer PCB 104 and are connected to applicable circuitry and pins or pads on PD chip 106 using wiring and vias embedded in PCB 104 (not separately shown). A platform PCB LGA 116 comprising a second plurality of platform LGA pads 118 having a second LGA pattern matching the first LGA pattern are disposed on the topside of a platform PCB 120.

During a manufacturing process, solder paste is patterned over platform LGA pads 118. During a subsequent solder reflow operation, respective pairs of platform LGA pads 118 and interposer LGA pads 114 are bounded by solder balls 122.

FIG. 1 also shows the Z-height of various components, where,

'A'—Platform PCB
'B'—Interposer solder balls
'C'—Interposer PCB
'D'—PD Circuitry
G'—Total Z-height of the assembled solution As illustrated and described in detail below, platform LGA pads 118 are mapped to a specific set of signals, voltages, and ground on platform PCB 120. These signals, voltages, and ground are coupled to interposer LGA pads 114 using a pre-defined LGA pattern. This enables different PD circuitry (e.g., PD controller chips provided by different sources/vendors and associated passive components) to be used for different PD interposers 102 to support dual type-C ports and associated functionality. Thus, the same system design may be used PD solutions provided by different sources and vendors (and/or using different PD controller chips) without having to make any changes to platform PCB 120.

Figure 2:
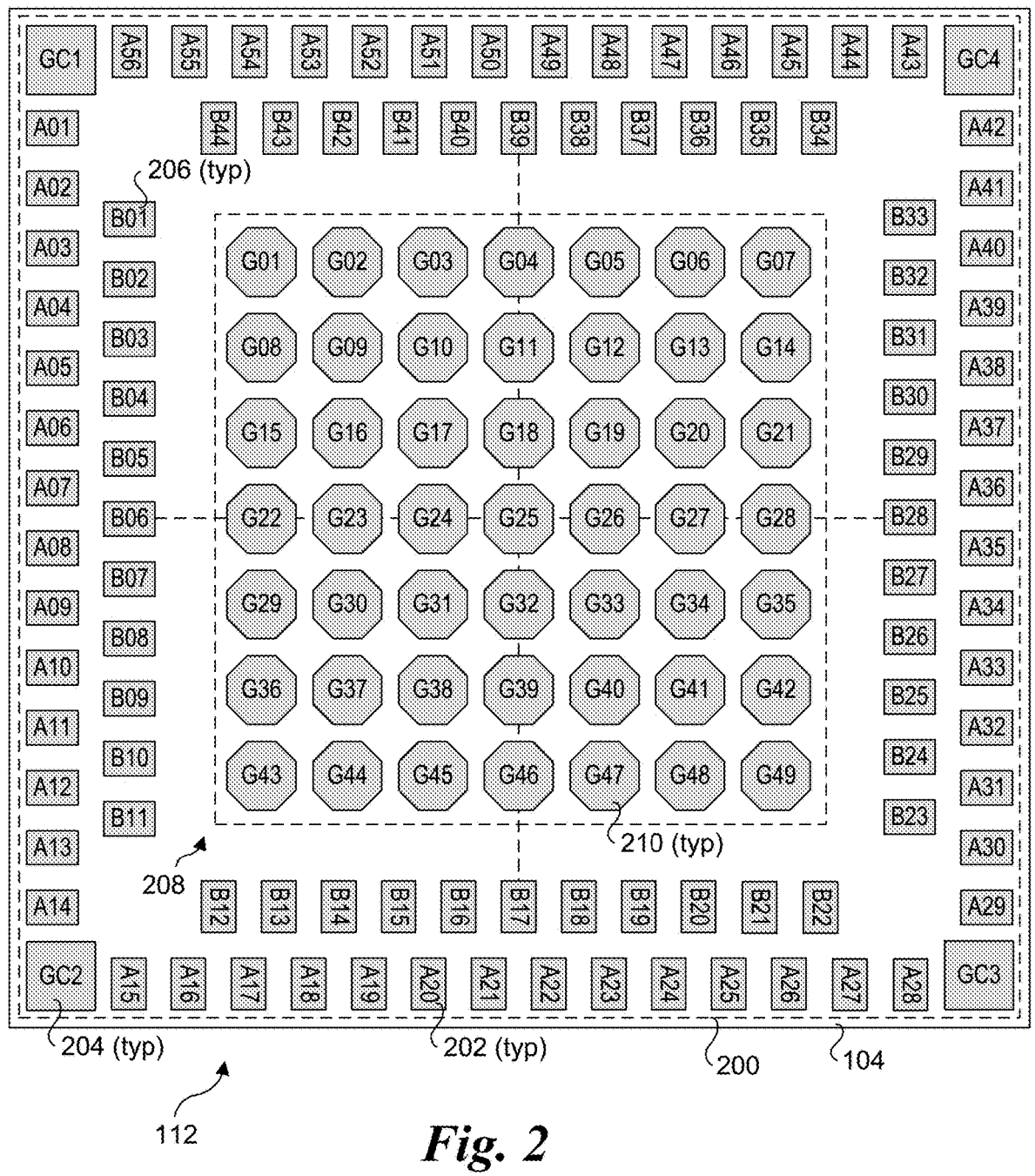
FIG. 2 is a diagram illustrating an LGA pattern of pads on the underside of an interposer, according to a first embodiment.

FIG. 2 shows an example of interposer LGA 112, according to one embodiment. As discussed above, interposer LGA 112 comprises a pattern 200 of LGA pads that are disposed on the underside of interposer PCB 104, such as using a conventional PCB manufacturing process. Generally, the LGA pads may employ a suitable conductor material, such as but not limited to gold or copper (or a thin layer of gold deposited over copper LGA pads). Pattern 200 includes an outer ring of 56 pads 202 disposed toward the edges of interposer PCB 104, labeled A01-A56 (numbered counter-clockwise in the Figures herein). Four square ground pads 204 labeled GC1, GC2, GC3 and GC4 are disposed in respective corners proximate to the edges of interposer PCB 104.

Next, there is an inner ring of 44 pads 206 offset from the edges of interposer PCB 104, labeled B01-B44 (also numbered counter-clockwise in the Figures herein). An array 208 of 49 octagon ground pads 210 is disposed toward the center of interposer PCB 104. In the illustrated embodiment of FIG. 2, the form factor of interposer PCB 104 is 11.9×11.9 millimeters (mm).

Figure 3:
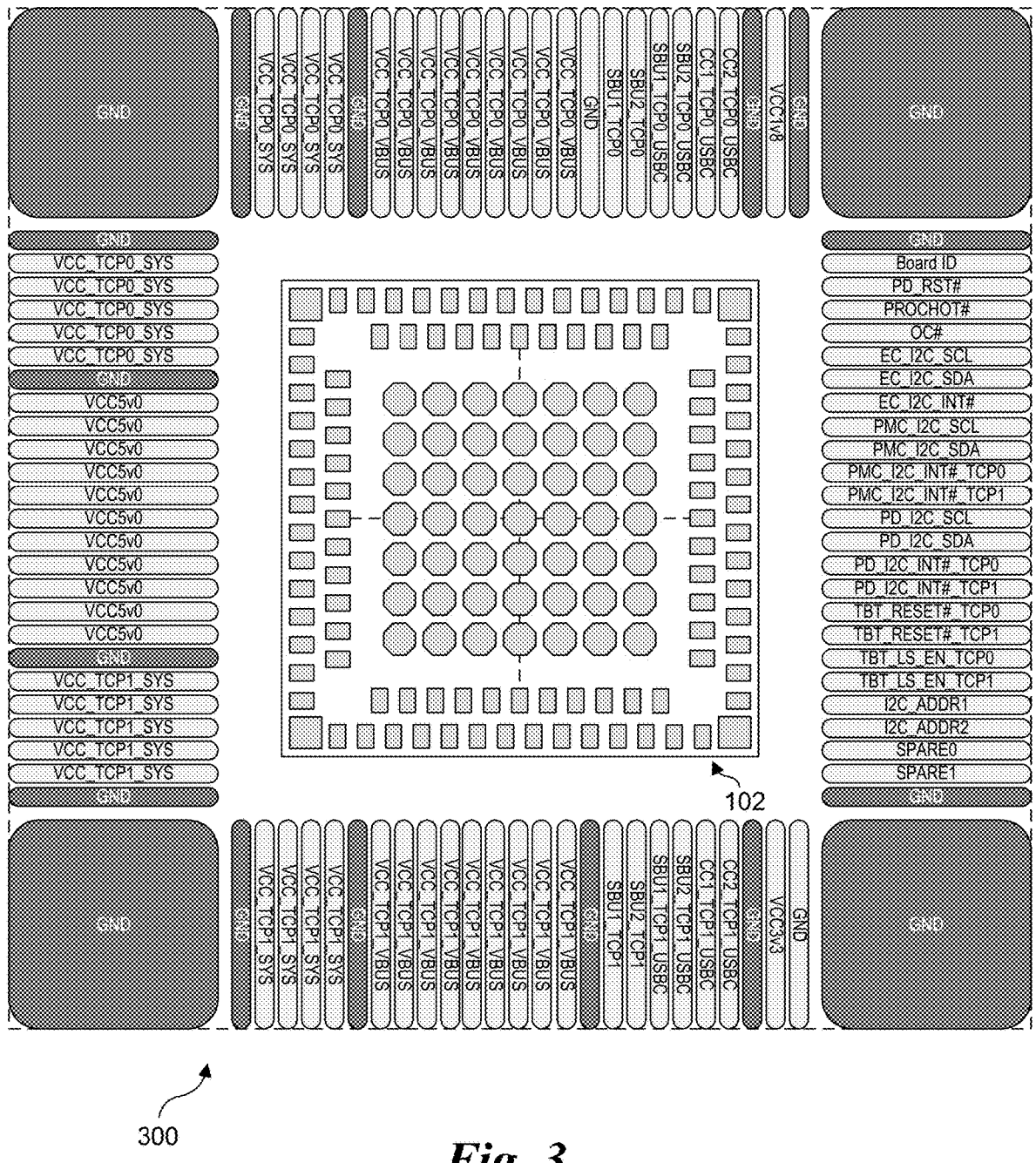
FIG. 3 is a diagram illustrating an exemplary set of USB4 I/O signals, voltages, and ground that are mapped to LGA pads for the LGA of FIG. 2, according to one embodiment.

In one embodiment, the interposer LGA supports a PD solution for two USB4 ports with the following capabilities:
Provider mode of 5v @ 3 A per port and 5v @ 1.5 W VCONN (over CC lines)
Consumer mode of up to 20v @ 4.5 A per port for Mobile
Provider mode of up to 20v @ 4.5 A per port for Desktop
VBUS short protection up to 20v on CC and SBU pins
3.3v power rail
Optional 1.8v power rail for future usages and future Intel's SoC
System signals such as PROCHOT and Over-Current
Two Spare GPIOs
Three I2C interfaces:
    EC I2C
    PMC I2C or Discrete TBT I2C
    TBT Retimer I2C FIG. 3 shows a diagram 300 illustrating an exemplary set of USB4 input/output (I/O) signals, voltages, and ground that are mapped to LGA pads for interposer LGA 112, according to one embodiment. FIGS. 3a, 3b, 3c, and 3d show zoomed in views of diagram 300.

Figure 3A:
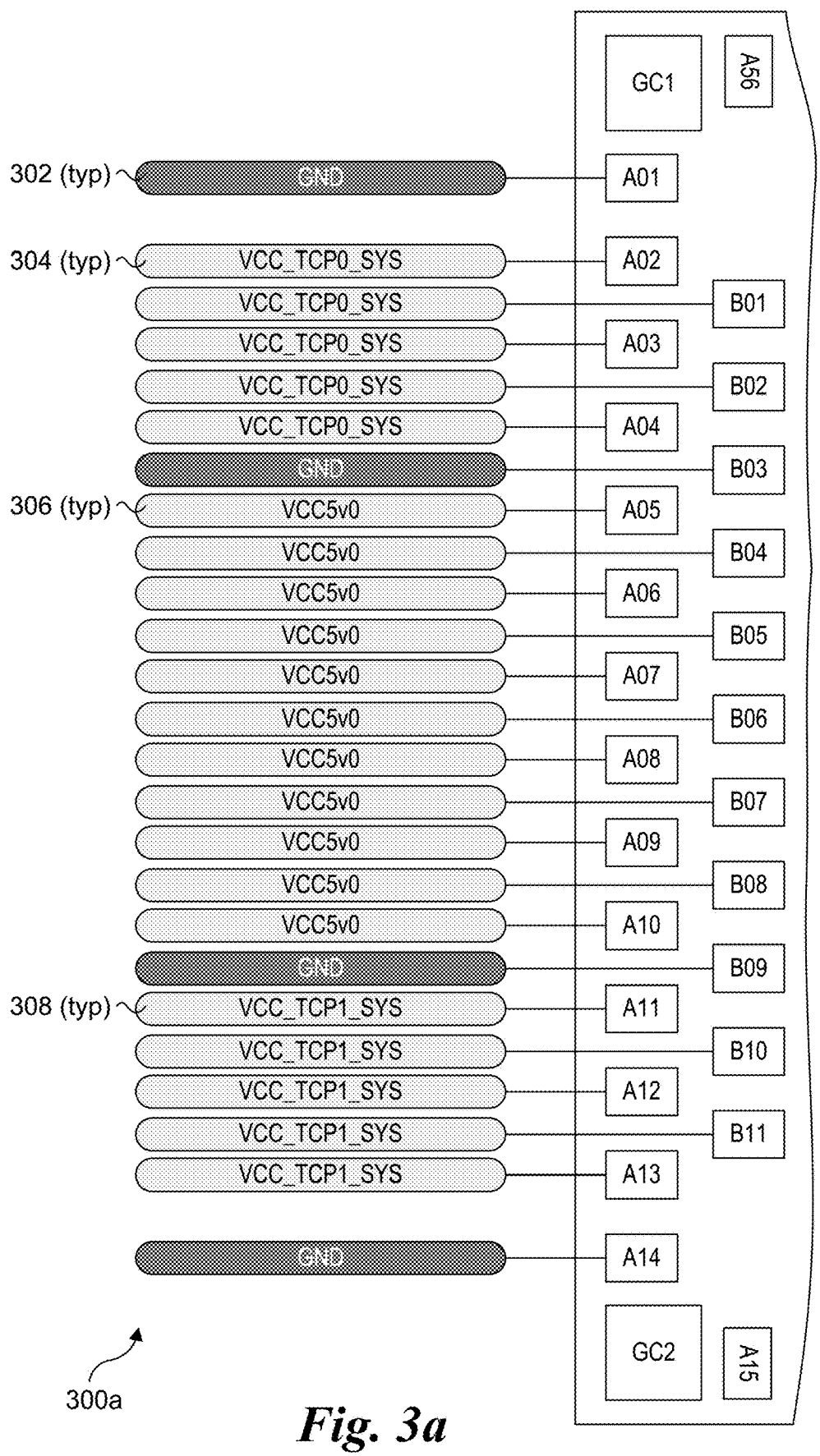
FIG. 3a is a zoomed in view of the diagram of FIG. 3 depicting an exemplary set of I/O signals, voltages, and ground that are coupled various LGA pads disposed toward the left side of the diagram.

FIG. 3a shows a diagram 300a depicting an exemplary set of I/O signals, voltages, and ground that are coupled various LGA pads disposed toward the left side of diagram 300. These include multiple instanced of GND (ground) 302, multiple instances of a VCC_TCPO_SYS voltage 304, multiple instances of a 5-volt (5v) VCC voltage 306, and multiple instances of a VCC_TCP1_SYS voltage 308.

Figure 3B:
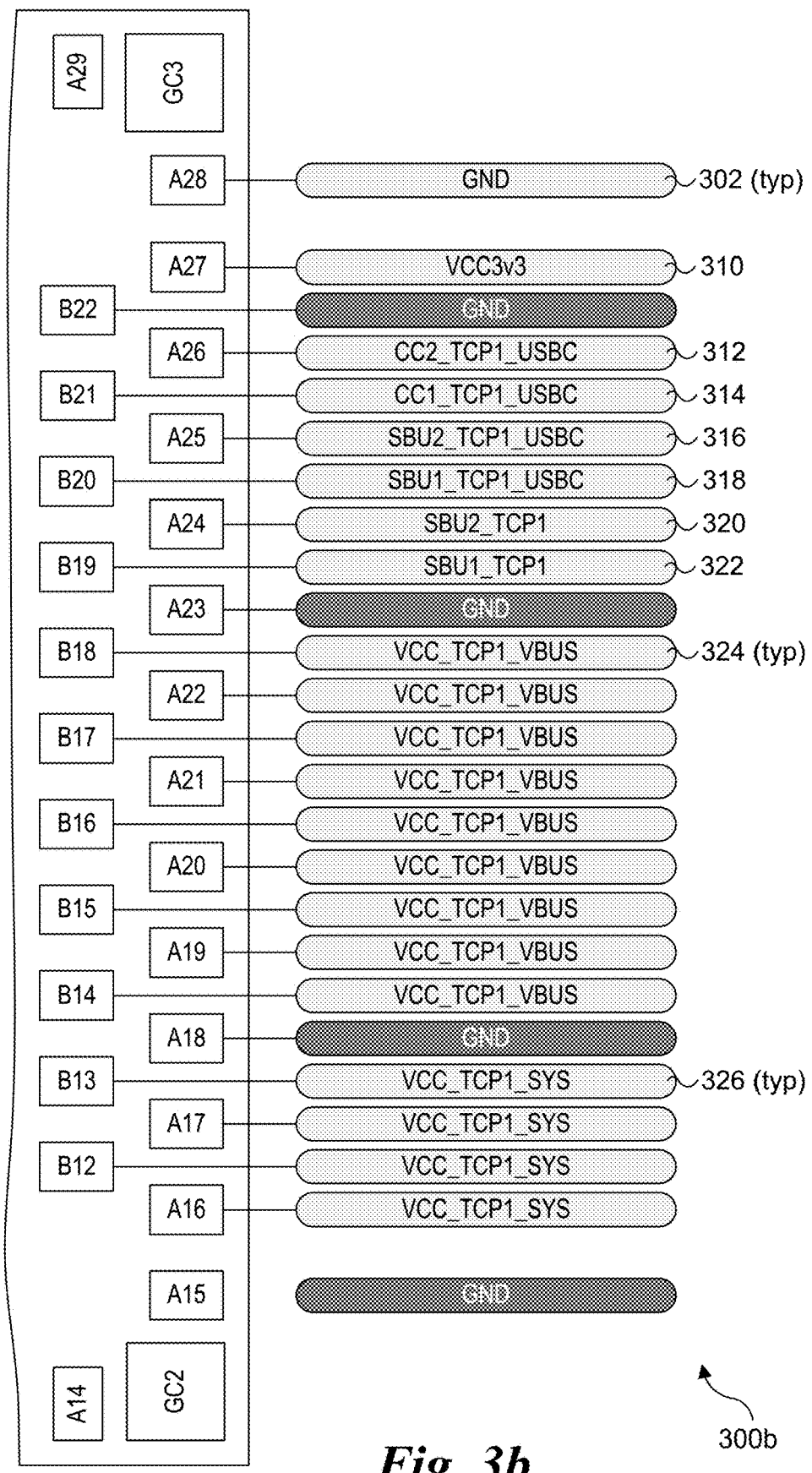
FIG. 3b is a zoomed in view of the diagram of FIG. 3 depicting an exemplary set of I/O signals, voltages, and ground that are coupled various LGA pads disposed toward the bottom side of the diagram, wherein the view if rotated counter-clockwise 90 degrees.

FIG. 3b shows a diagram 300b depicting an exemplary set of I/O signals, voltages, and ground that are coupled various LGA pads disposed toward the bottom of diagram 300, where diagram 300 has been rotated 90 degrees counter-clockwise. The I/O signals, voltages and ground include multiple instances of GND 302, a 3-volt VCC3v3 voltage 310, a CC2_TCP1_USBC signal 312, a CC1_TCP1_USBC signal 314, an SBU2_TCP1_USBC signal 316, an SBU1_TCP1_USBC signal 318, an SUB2_TCP1 signal 320, an SUB1_TCP1 signal 322, multiple instances of a VCC_TCP1_VBUS voltage 324, and multiple instances of a VCC_TCP1_SYS voltage 326.

Figure 3C:
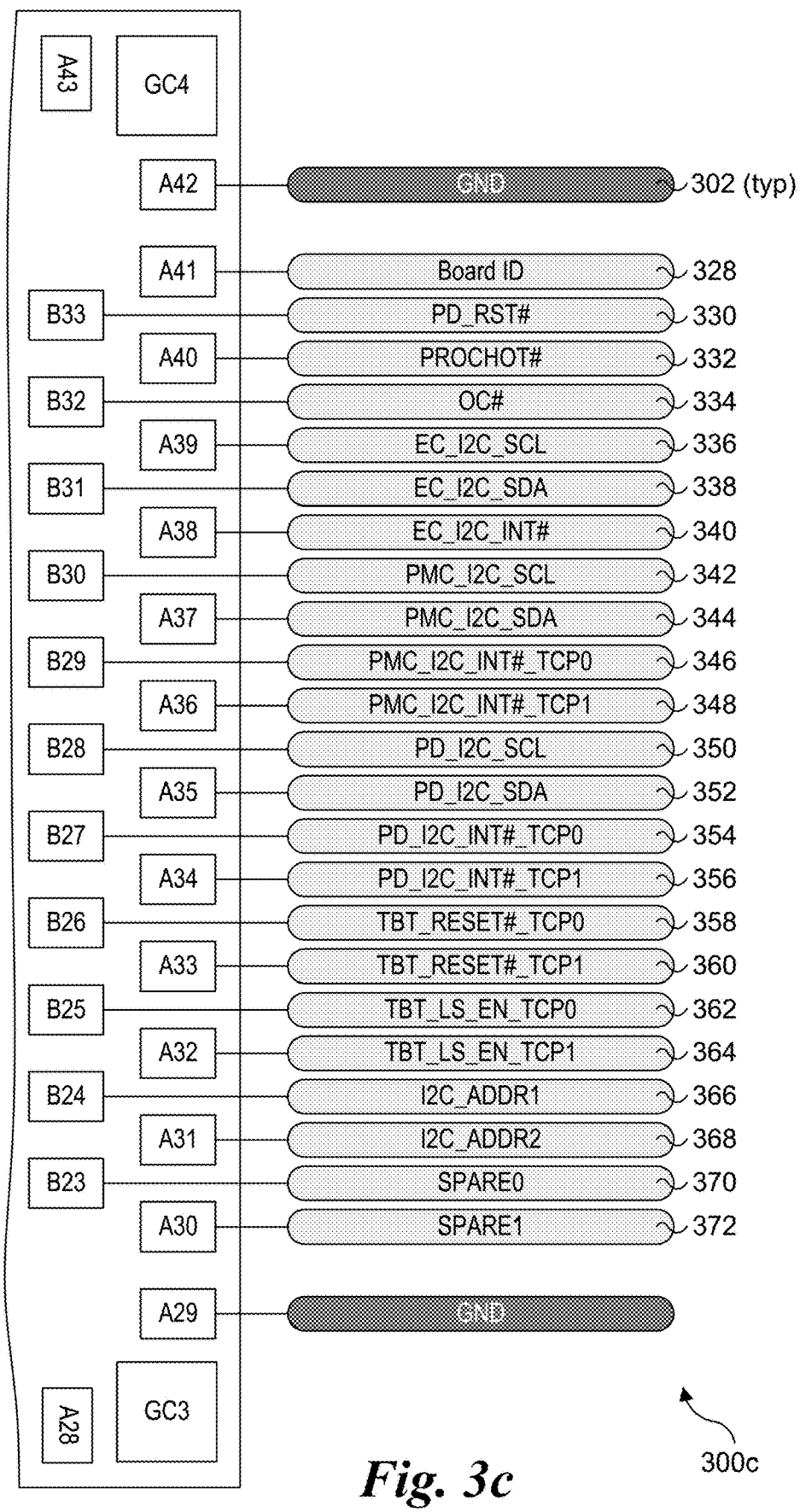
FIG. 3c is a zoomed in view of the diagram of FIG. 3 depicting an exemplary set of I/O signals, voltages, and ground that are coupled various LGA pads disposed toward the right side of the diagram.

FIG. 3c shows a diagram 300c depicting an exemplary set of I/O signals, voltages, and ground that are coupled various LGA pads disposed toward the right side of diagram 300. These include multiple instance of GND 302, a Board ID signal 328, a PD_RST #signal 330, a PROCHOT #signal 332, an OC #signal 334, an EC_I2C_SCL signal 336, an EC_I2C_SDA signal 338, an EC_I2C_INT #signal 340, a PMC I2C_SCL signal 342, a PMC I2C_SDA signal 344, a PMC I2C_INT #TCP0 signal 346, a PMC I2C_INT #TCP1 signal 348, a PD_I2C_SCL 350, a PD_I2C_SDA 352, a PD_I2C_INT #TCP0 signal 354, a PD_I2C_INT #_TCP1 signal 356, a TBT_RESET #TCP0 signal 358, a TBT_RESET #TCP1 signal 360, a TBT_LS_EN_TCP0 signal 362, a TBT_LS_EN_TCP1 signal 364, an I2C_ADDR1 signal 366, an I2C_ADDR2 signal 368, a SPARE0 signal 370, and a SPARE1 signal 372.

Figure 3D:
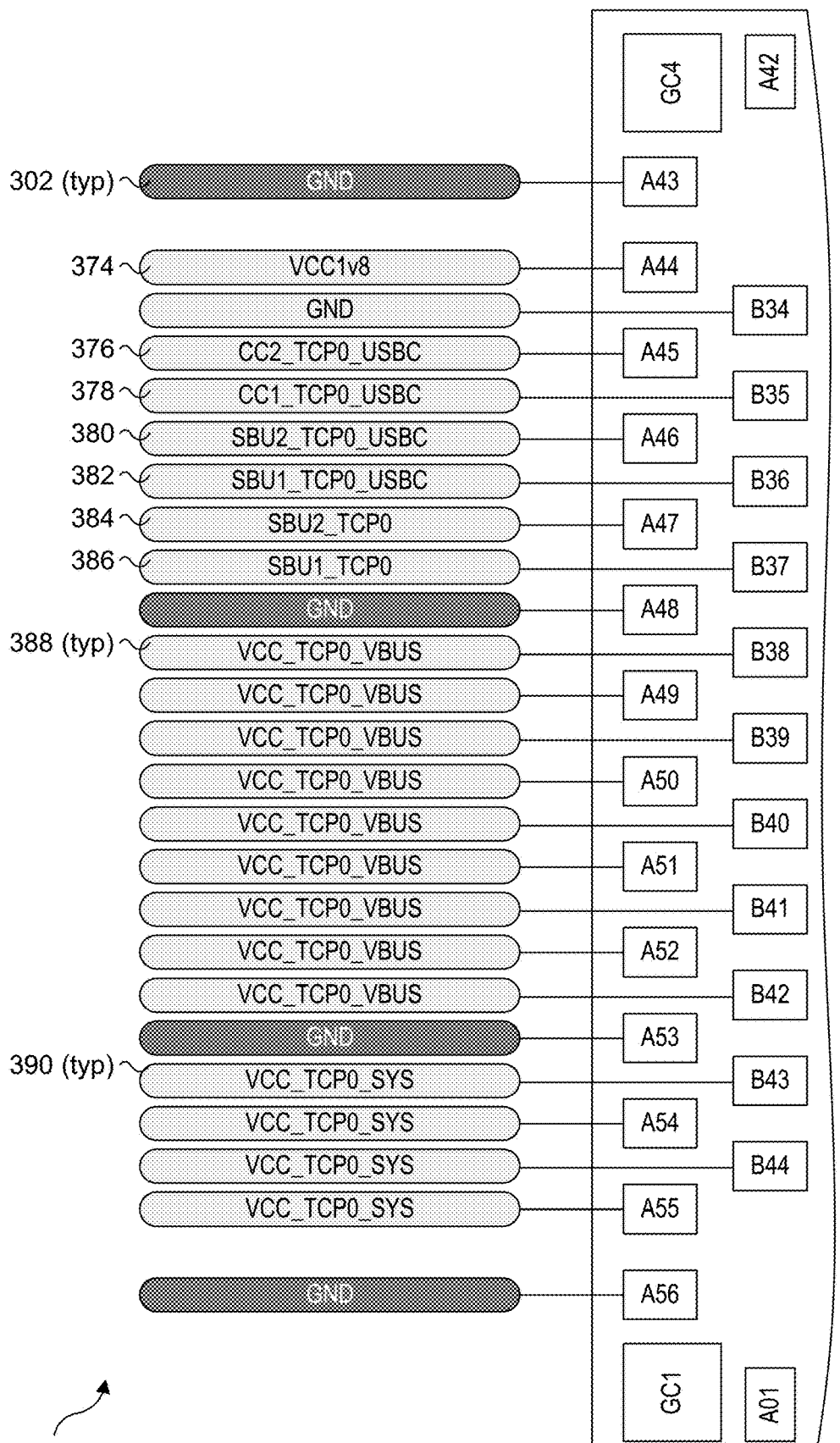
FIG. 3d is a zoomed in view of the diagram of FIG. 3 depicting an exemplary set of I/O signals, voltages, and ground that are coupled various LGA pads disposed toward the top of the diagram, wherein the view if rotated clockwise 90 degrees.

FIG. 3d shows a diagram 300d depicting an exemplary set of I/O signals, voltages, and ground that are coupled various LGA pads disposed toward the top of diagram 300, where diagram 300 has been rotated 90 degrees clockwise. These include multiple instances of GND 302, a VCC1v8 voltage 374, a CC2_TCP0_USBC signal 376, a CC2_TCP0_USBC signal 378, an SBU2_TCP0_USBC signal 380, an SBU1_TCP0_USBC signal 382, an SBU2_TCP0 signal

384, an SBU1_TCP0 signal 386, multiple instances of a VCC_TCP0_BUS voltage 388, and multiple instances of VCC_TCP0_SYS 390.

Figure 4:
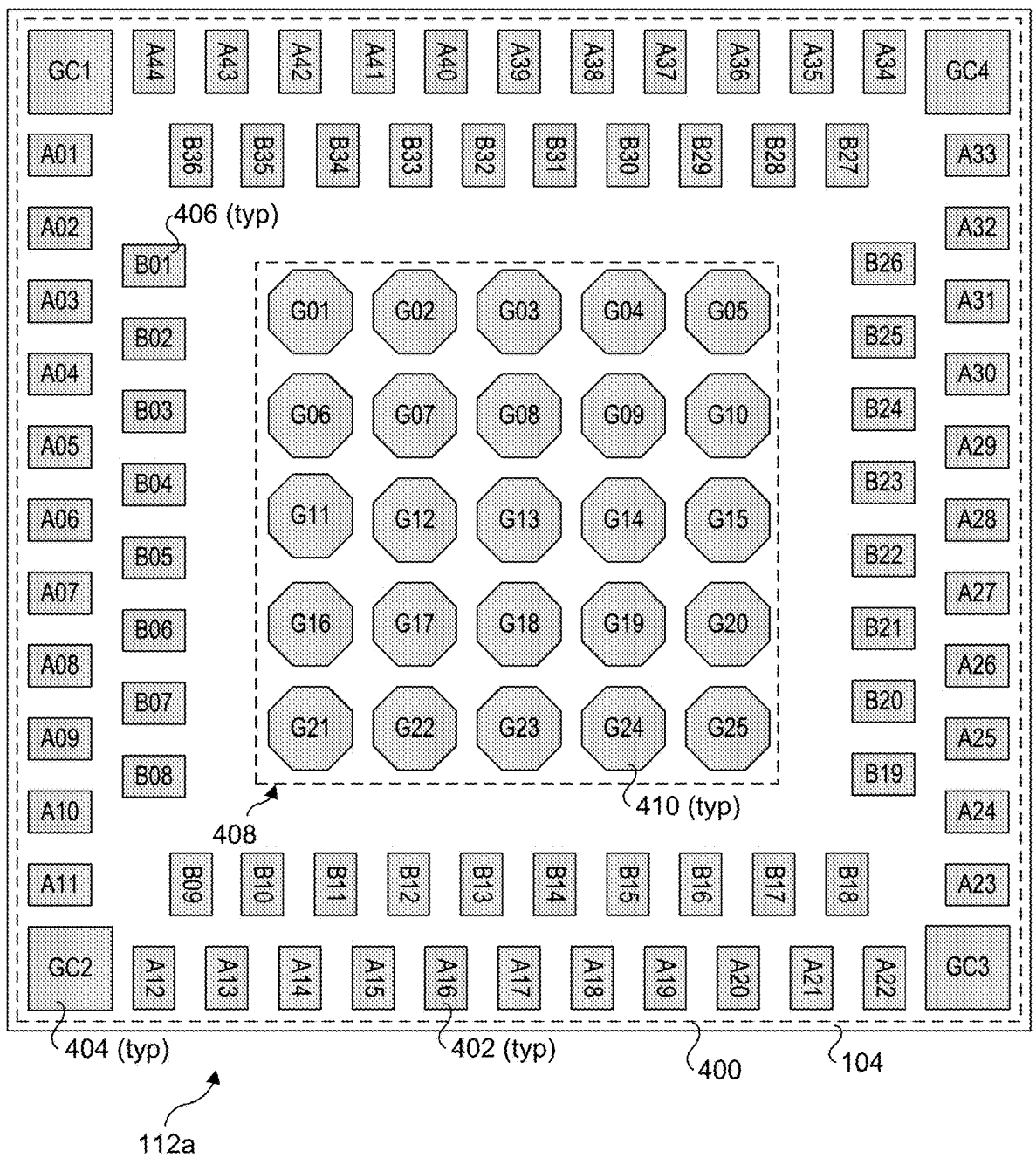
FIG. 4 is a diagram illustrating an LGA pattern of pads on the underside of an interposer, according to a second embodiment.

FIG. 4 shows a second example of an interposer LGA 112a, according to one embodiment. Interposer LGA 112a comprises a pattern 400 of LGA pads that are disposed on the underside of interposer PCB 104 that includes an outer ring of 44 LGA pads 402 disposed toward the edges of interposer PCB 104, labeled A01-A44. Four ground pads 404 labeled GC1, GC2, GC3 and GC4 are disposed in respective corners proximate to the edges of interposer PCB 104. LGA 112A also includes an inner ring of 36 LGA pads 406 offset from the edges of interposer PCB 104, labeled B01-B36. An array 408 of 24 hexagon ground pads 410 is disposed toward the center of interposer PCB 104.

In one embodiment, LGA 112a has a form factor of 9.8×9.8 mm. In one embodiment, LGA pads 402 and 406 have a size of 400 um×600 um with a pitch of 700 um. Square ground pads 404 are 800 um×800 um, while octagon ground pads 410 are likewise 800 um×800 um.

Mappings for the LGA pads for LGA 112 are shown in the following tables. The I/O, power, and ground signals in the tables have the same names as corresponding signals shown in FIGS. 3 and 3a-3d above described above.

TABLE 1

Power and Ground Signals

| Signal | Pad Number | Type | Description |
|---|---|---|---|
| VCC3v3 | A02 | Input | Main 3.3 v power supply to PD controller and periphery |
| VCC1v8 | B01 | Input | Auxiliary 1.8 v power supply (mainly used to support Hayden Bridge re-timer) |
| VCC5v0 | A03, A04, A05, A06, A07, A08, B02, B03, B04, B05, B06, B07 | Input | Main 5.0 v power supply to internal source path and/or VCONN over CC lines |
| GND | GC1, GC2, GC3, GC4, A01, A11, A12, A22, A23, A33, A34, A44, G01, G02, G03, G04, G05, G06, G07, G08, G09, G10, G11, G12, G13, G14, G15, G16, G17, G18, G19, G20, G21, G22, G23, G24, G25 | Ground | Ground |

TABLE 2 shows mappings for I/O signals comprising a Type-C interface in accordance with a Type-C standard.

TABLE 2

Type-C Interface

| Signal | Pad Number | Type | Description |
|---|---|---|---|
| TCP0_VBUS | A41, A42, A43, B34, B35, B36 | Input/Output | VBUS pins of Port 0 (TCP0), supports source and/or monitor for sink path and dead battery mode |
| C_TCP0_CC1 | B27 | Input/Output | CC1 (Communication Channel) of Port 0 (TCP0) |
| C_TCP0_CC2 | A35 | Input/Output | CC2 (Communication Channel) of Port 0 (TCP0) |
| C_TCP0_SBU1 | B28 | Input/Output | SBU1 (Side Band signal) of Port 0 (TCP0) to support AUX (DPAM) or LSX (USB4) |
| C_TCP0_SBU2 | A36 | Input/Output | SBU2 (Side Band signal) of Port 0 (TCP0) to support AUX (DPAM) or LSX (USB4) |
| TCP1_VBUS | A13, A14, A15, B09, B10, B11 | Input/Output | VBUS pins of Port 1 (TCP1), supports source and/or monitor for sink path and dead battery mode |
| C_TCP1_CC1 | B18 | Input/Output | CC1 (Communication Channel) of Port 1 (TCP1) |
| C_TCP1_CC2 | A21 | Input/Output | CC2 (Communication Channel) of Port 1 (TCP1) |
| C_TCP1_SBU1 | B17 | Input/Output | SBU1 (Side Band signal) of Port 1 (TCP1) to support AUX (DPAM) or LSX (USB4) |
| C_TCP1_SBU2 | A20 | Input/Output | SBU2 (Side Band signal) of Port 1 (TCP1) to support AUX (DPAM) or LSX (USB4) |

TABLE 3 shows mappings for GPIO (General-Purpose IO) signals comprising a GPIO interface.

TABLE 3

| | | GPIO Interface | |
|---|---|---|---|
| Signal | Pad Number | Type | Description |
| PROCHOT# | A24 | Input/Output | Processor Hot Indication to PD Controller (active low) |
| PD_RST# | B19 | Input | PD Main Reset (active low) - used by CYPD6227 only |

TABLE 3-continued

| | | GPIO Interface | |
|---|---|---|---|
| Signal | Pad Number | Type | Description |
| SPARE0 | A09 | Input/Output | Spare I/O of PD controller - user defined |
| SPARE1 | B08 | Input/Output | Spare I/O of PD controller - user defined |
| SPARE2 | A10 | Input/Output | Spare I/O of PD controller - user defined |

TABLE 4 shows mappings for input and output signals used for a power path interface.

TABLE 4

| | | Power Path Interface | |
|---|---|---|---|
| Signal | Pad Number | Type | Description |
| TCP0_SNK_EN | B30 | Output | External Sink enable path of Port 0 (TCP0) |
| TCP0_SRC_EN | A38 | Output | External Source enable path of Port 0 (TCP0) |
| TCP0_DIS_EN | B31 | Output | Discharge VBUS using external power path of Port 0 (TCP0) |
| TCP0_SRC_IMON | A39 | Input | Current sensing of external source path of Port 0 (TCP0) |
| TCP0_SW_FLT# | B32 | Input | External Sink/Source Power Path Fault indication (active low) of Port 0 (TCP0) |
| TCP1_SNK_EN | B15 | Output | External Sink enable path of Port 1 (TCP1) |
| TCP1_SRC_EN | A18 | Output | External Source enable path of Port 1 (TCP1) |
| TCP1_DIS_EN | B14 | Output | Discharge VBUS using external power path of Port 1 (TCP1) |
| TCP1_SRC_IMON | A17 | Input | Current sensing of external source path of Port 1 (TCP1) |
| TCP1_SW_FLT# | B13 | Input | External Sink/Source Power Path Fault indication (active low) of Port 1 (TCP1) |

The output signals in TABLE 5 are used for board identification.

TABLE 5

| | | Board Identification | |
|---|---|---|---|
| Signal | Pad Number | Type | Description |
| BOARD_ID0 | A25 | Output | MSB of Board Identification to distinguish between LGA modules with different PD controllers |
| BOARD_ID1 | B20 | Output | LSB of Board Identification to distinguish between LGA modules with different PD controllers |

TABLE 6 shows mappings for I/O signals comprising a high speed controller interface in accordance with a Type-C standard.

TABLE 6

| | | High Speed Controller Interface | |
|---|---|---|---|
| Signal | Pad Number | Type | Description |
| TCP0_SBU1 | B29 | Input/Output | SBU1 (Side Band signal) of Controller 0 to support AUX (DPAM) or LSX (USB4); VBUS-Short Protected |

TABLE 6-continued

High Speed Controller Interface

| Signal | Pad Number | Type | Description |
|---|---|---|---|
| TCP0_SBU2 | A37 | Input/Output | SBU2 (Side Band signal) of Controller 0 to support AUX (DPAM) or LSX (USB4); VBUS-Short Protected |
| TCP0_RST# | A40 | Output | Main Reset signal of Thunderbolt Re-timer of TCP0 (active low) |
| TCP0_LS_EN | B33 | Output | Enable Load Switch signal for Thunderbolt Re-timer of TCP0 |
| TCP1_SBU1 | B16 | Input/Output | SBU1 (Side Band signal) of Controller 1 to support AUX (DPAM) or LSX (USB4); VBUS-Short Protected |
| TCP1_SBU2 | A19 | Input/Output | SBU2 (Side Band signal) of Controller 1 to support AUX (DPAM) or LSX (USB4); VBUS-Short Protected |
| TCP1_RST# | A16 | Output | Main Reset signal of Thunderbolt Re-timer of TCP1 (active low) |
| TCP1_LS_EN | B12 | Output | Enable Load Switch signal for Thunderbolt Re-timer of TCP1 |

TABLE 7 shows mappings for input, output, and I/O signals comprising I2C interface in accordance with an I2C interface standard.

TABLE 7

I2C Interface

| Signal | Pad Number | Type | Description |
|---|---|---|---|
| EC_I2C_SCL | A32 | Input | EC I2C Bus - Clock Signal (PD Controller is slave) |
| EC_I2C_SDA | B26 | Input/Output | EC I2C Bus - Data Signal (PD Controller is slave) |
| EC_I2C_INT# | A31 | Output | EC I2C Bus - Interrupt Signal (active low) |
| PMC_I2C_SCL | B25 | Input | PMC (SoC/Thunderbolt Controller) I2C Bus - Clock Signal (PD Controller is slave) |
| PMC_I2C_SDA | A30 | Input/Output | PMC (SoC/Thunderbolt Controller) I2C Bus - Data Signal (PD Controller is slave) |
| PMC_I2C_INT#_TCP0 | B24 | Output | PMC (SoC/Thunderbolt Controller) I2C Bus - Interrupt of Port 0 (active low) |
| PMC_I2C_INT#_TCP1 | A29 | Output | PMC (SoC/Thunderbolt Controller) I2C Bus - Interrupt of Port 1 (active low) |
| PD_I2C_SCL | B23 | Output | PD I2C Bus - Clock Signal (PD Controller is master) |
| PD_I2C_SDA | A28 | Input/Output | PD I2C Bus - Data Signal (PD Controller is master) |
| PD_I2C_INT#_TCP0 | B22 | Input | PD I2C Bus - Interrupt of Port 0 (active low) |
| PD_I2C_INT#_TCP1 | A27 | Input | PD I2C Bus - Interrupt of Port 1 (active low) |
| I2C_ADDR1 | A26 | Input | EC I2C Address setting 1 - used by all 4 PD controllers |
| I2C_ADDR2 | B21 | Input | EC I2C Address setting 2 - used by TPS65994 only |

Figure 5:
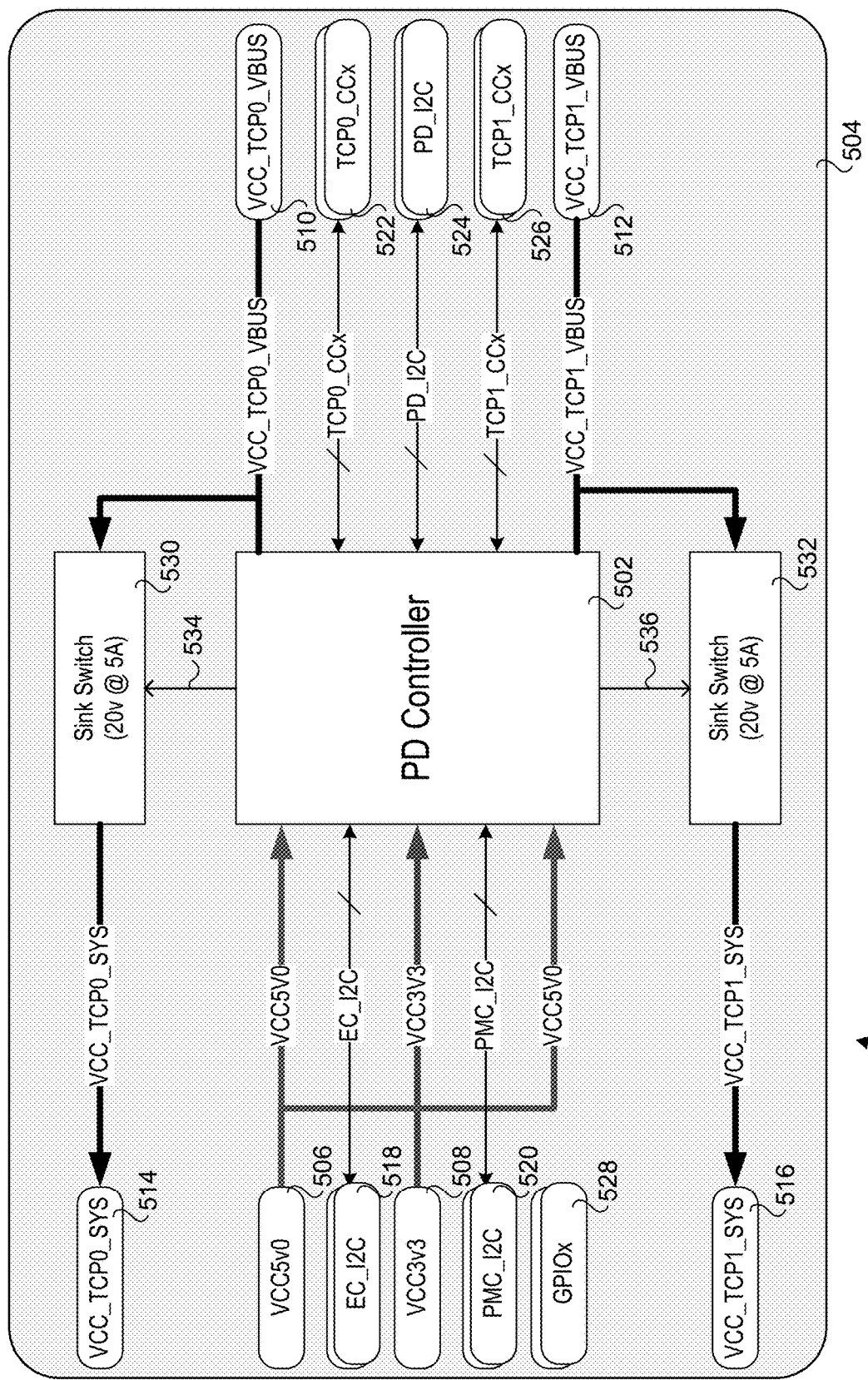
FIG. 5 is a diagram illustrating selected voltage and I/O signals for a dual type-C port PD module, according to one embodiment.

FIG. 5 shows a diagram illustrating selected power and I/O signals for a dual type-C port PD module 500. The PD module includes a PD controller 502 mounted to a PCB or substrate 504. The ovals represent power and I/O signals that are coupled via mating LGA pads on the PD module and the platform PCB.

The power signals shown in FIG. 5 include a 5-volt VCC5v0 signal 506, a 3.3-volt VCC3v3 signal 508, a VCC_TCP0_VBUS signal 510, a VCC_TCP1_VBUS signal 512, a VCC_TCP0_SYS signal 514 and a VCC_TCP1_SYS signal 516. The I/O signals include EC_I2C signals 518, PMC I2C signals 520, TCP0_CCx signals 522, PD_I2C signals 524, and TCP1_CCx signals 526. Depending on the PD controller used for a given PD solution, GPIOx signals 528 may or may not be used.

In addition to PD controller 502, a dual type-C port PD module will include various passive circuit elements, such as resistors, capacitors, inductors, etc., and active circuit elements, including sink switches 530 and 532. As shown, sink switch 530 receives a control input 534 from PD controller 502, while sink switch 532 receive a control input 536 from PD controller 502. In one non-limiting example, sink switches 530 and 532 are MOSFETs, noting other types of switches capable of handling the power through the switch may be used.

As provided in TABLE 1 above, VCC5v0 signal 506 is the main 5.0v power supply to internal source path and/or VCONN over CC lines, while VCC3v3 signal 508 is the main 3.3v power supply to PD controller and periphery. The power for both of these power signals is a power supply or power source coupled to the platform PCB, such as a DC power supply for a desktop platform or a battery for a mobile platform. As will be recognized by those skilled in the art, the platform will generally include applicable voltage regulation (VR) circuitry that is not shown separately in the Figures herein.

Under the USB Type-C standard, a USB device coupled to a USB Type-C port may operate as a power source or a power sink. When the USB device is a USB power sink, such as a USB flash drive or solid-state drive (SSD) with a Type-C interface, VCC_TCP0_VBUS signal 510 will be coupled to VCC5V0 via a switch in PD controller 502 and will provide power to a USB sink device connected to a first USB Type-C port 0, while VCC_TCP1_VBUS signal 512 will be coupled to VCC5V0 via a second switch in PD controller 502 and will provide power to a USB device connected to a second USB Type-C port 1.

For mobile platforms, a USB power source/supply may be connected to a USB Type-C port and provide power to the platform's battery/charge subsystem. For example, suppose a USB power supply/source is connected to USB type-C port 0. In response, circuitry on the platform and/or PD controller will detect that USB power source/supply is connected to a USB type-C port 0 and logic in PD controller 502 will disconnect VCC5v0 from VCC_TCP0_VBUS 510 and activate a sink switch 530 to sink power provided by the USB power source/supply over VCC_TCP1_VBUS 512 to VCC_TCP0_SYS power signal 514, which is coupled to the battery/charge system. Likewise, when a USB power supply/source is connected to USB type-C port 1, the circuitry on the platform and/or PD controller will detect this and will disconnect VCC5v0 from VCC_TCP1_VBUS 512 and activate a sink switch 530 to sink power provided by the USB power source/supply to connect VCC_TCP1_VBUS 512 to VCC_TCP1_SYS power signal 516, which is coupled to the battery/charge system.

Generally, for a desktop platform the platform PCB and/or the PD controller will be configured to detect a USB device comprising a power source coupled to USB Type-C port 0 or 1 and prevent power from flowing from the USB power source to the platform.

Figure 6:
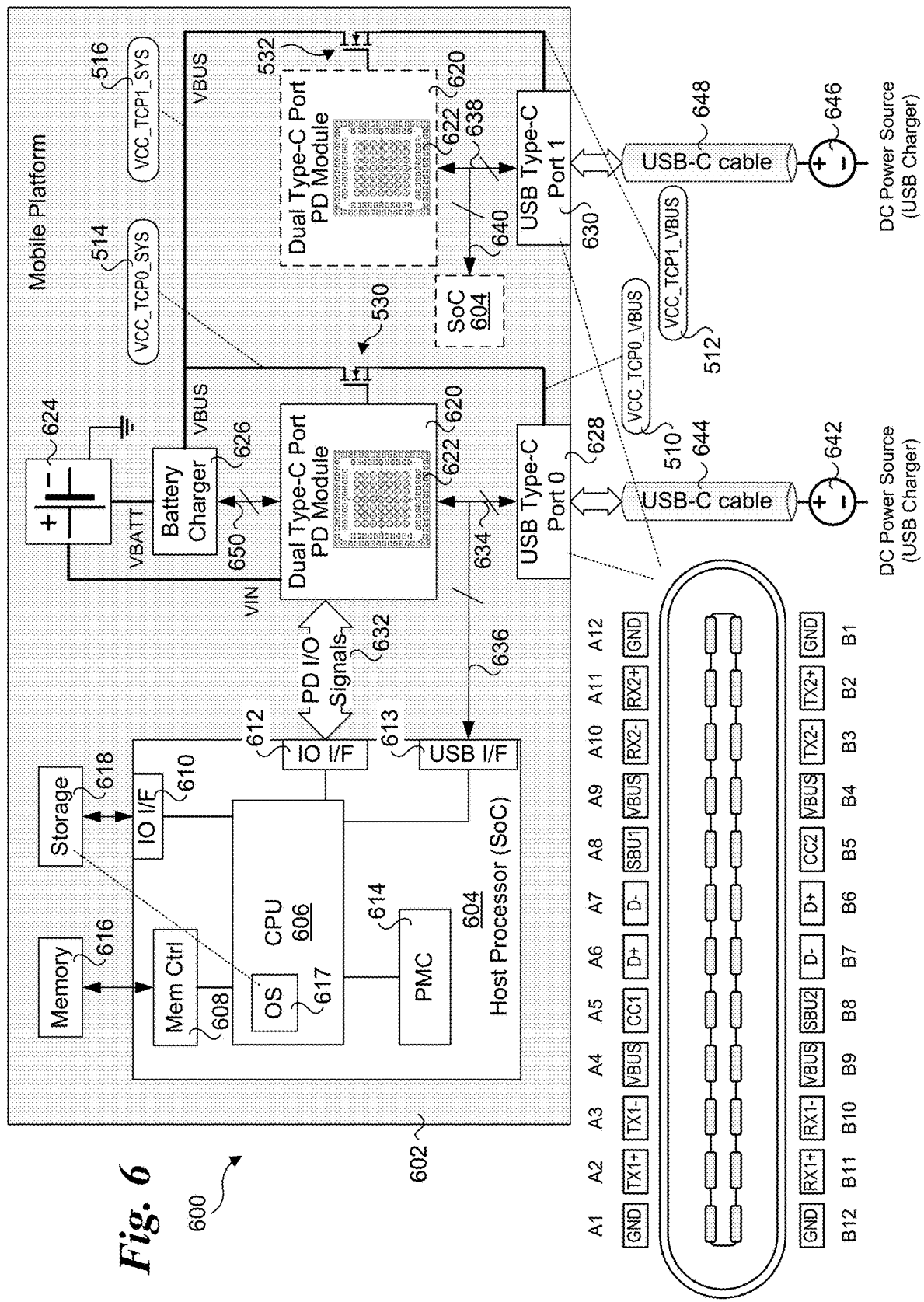
FIG. 6 is a schematic diagram of an example of a mobile platform with two USB type-C ports employing a dual type-C port PD module.

FIG. 6 shows an example of a mobile platform 600 employing a dual type-C port PD module. Mobile platform 600 includes a platform PCB 602 to which an SoC 604 comprising a host process is mounted. SoC 604 includes a central processing unit (CPU) 606 having one or more processor cores, a memory controller 608, I/O interfaces (I/F) 610 and 612, a USB interface 613, and a power management controller (PMC) 614. Memory 616 comprising one or more memory devices mounted on PCB 602 or coupled to PCB 602 is communicatively-coupled to memory controller 608 via one or more memory channels. Mobile platform 600 includes a host operating system 617 that is loaded from a storage device 618 coupled to JO interface 610 into memory 616 and executed on one or more processor cores in CPU 606.

A dual type-C port PD module 620 is soldered down to platform PCB 602 via an LGA 622 disposed on the underside of on the PD module's PCB or substrate. Mobile platform 600 also includes a battery subsystem including a battery 624 and batter charger 626, along with associated control and power VR circuitry (not separately shown). Mobile platform 600 further includes two USB type-C ports 628 and 630 (also labeled Port 0 and Port 1) are coupled to PCB 602.

Selected I/O and power signals are shown as abstracted sets of signals, as depicted by I/O signals 632 and USB type-C port signals 634, 636, 638, and 640. A representation of the USB type-C port interface is shown in the lower left portion of FIG. 6, and includes 20 pins used for power and I/O signals, and four ground pins. Signals 634 are coupled between USB type-C port 628 and pads on LGA 622, while signals 636 are coupled to SoC 604 at USB interface 613. Similarly, signals 638 are coupled between USB type-C port 630 and pads on LGA 622, while signals 640 are coupled to SoC 604 at USB interface 613.

FIG. 6 shows a DC power source (USB charger) 642 comprising a USB power source/supply coupled to USB type-C port 628 via a USB type-C cable 644, and a DC power source 646 coupled to USB type-C port 630 via a USB type-C cable 648. As will be recognized, in practice a single USB power source/supply would be connected to a mobile platform and the use of two USB power sources here is to illustrate either of Port 0 or Port 1 may be used for charging.

As discussed above, when a USB power source/supply is connected to a type-C port the presence of source voltage is detected. Specifically, the VBUS voltage at pins A4, A9, B4, and B9 of the USB plug at the end of the USB cable will be detected and a sink switch will be activated to connect VBUS to the battery charger. Using the signal nomenclature from above, for power received at Port 0, VCC_TCP0_VBUS signal 510 would be coupled as VCC_TCP0_SYS signal 514 via sink switch 530 to battery charger 626. Similarly, for power received at Port 1, VCC_TCP1_VBUS signal 512 would be coupled as VCC_TCP1_SYS signal 516 via sink switch 532 to battery charger 626. As further illustrated, dual type-C port PD module is also configured to communicate with battery charger 626 using signals 650, which would be coupled via pad in LGA 622.

Figure 7A:
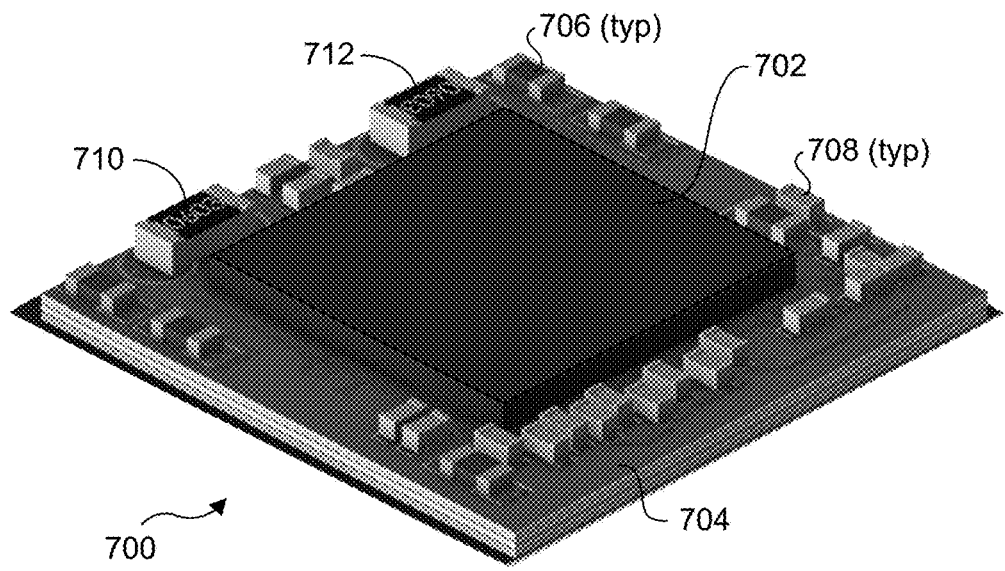
FIGS. 7a and 7b respectively show 3D perspective top-side and underside views of a dual type-C port PD module, according to one embodiment.
Figure 7B:
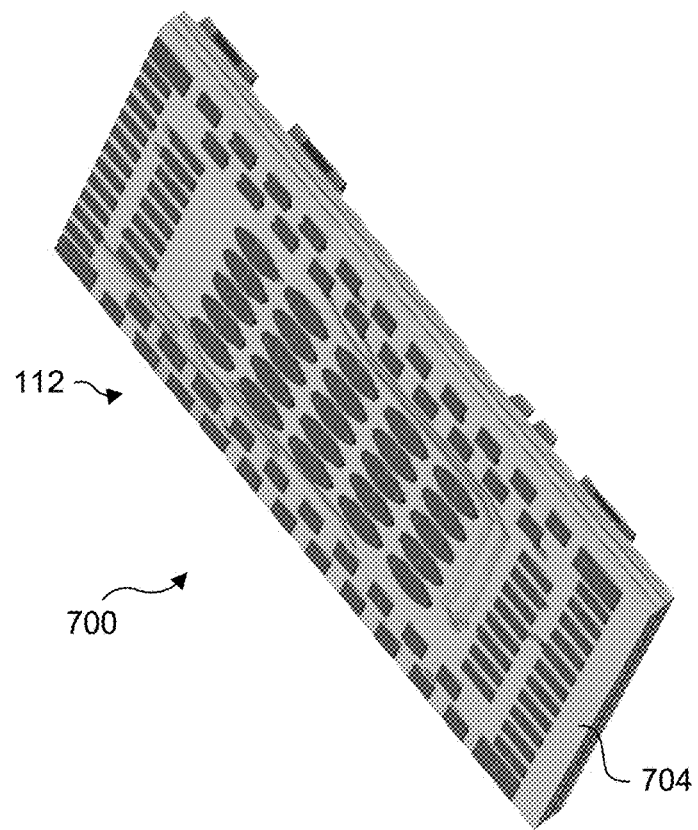

FIGS. 7a and 7b respectively show 3D perspective topside and underside views of a dual type-C port PD module 700, according to one embodiment. dual type-C port PD module 700 includes a PD controller 702 mounted to an interposer PCB 704. Various passive circuit elements are also mounted to interposer PCB 704, as depicted by resistors 706 and capacitors 708. A pair of sense resistors 710 and 712 are also mounted to interposer PCB 704. As shown in FIG. 7b, an LGA 112 comprising a pattern of LGA pads is disposed on the underside of interposer PCB 704. PCB 704 further includes various layers and vias used for routing wiring between the various circuit components and LGA pads. In the illustrated embodiment, LGA 112 has the pattern 200 shown in FIG. 2. In another embodiment, an LGA 112a having pattern 400 shown in FIG. 4 may be used. More generally, LGAs having other patterns may likewise be used.

As discussed above, the embodiments disclosed herein enable the use of different PD controllers with the same platform PCB. Various existing and future PD controllers supporting dual type-C ports may be used. Non-limiting examples of existing PD controllers include a Texas Instruments® TPS65994, a Cypress Semiconductor® CYPD6227, Realtek® RTS5453H and RTS5453H-Q6, and an ITE IT8857. The pre-defined interface for the LGAs described and illustrated above provides generic pinouts comprising a superset of power and I/O signals, where a portion (or potentially all) of the superset of power and I/O signals may be used by a given PD controller.

Manufacturing Process

Figure 8:
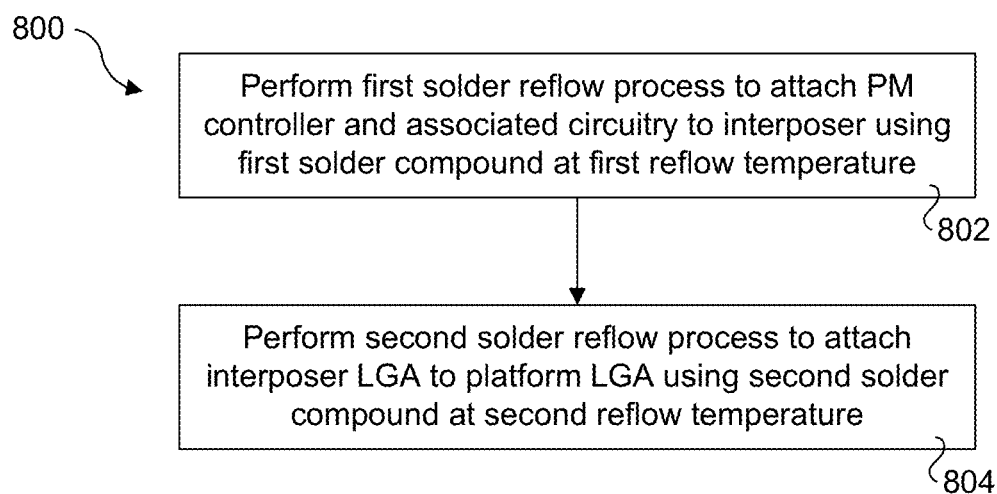
FIG. 8 is a flowchart illustrating a dual reflow process, according to one embodiment.

FIG. 8 shows a high-level flowchart 800 illustrating one embodiment of a manufacturing process including two reflow operations. Prior to the reflow operations various Also, PCB or substrate manufacturing processes would be used to form the PCB wiring and vias. This would include patterning solder pads on the PCBs or substrates, including the LGA pads for the interposer LGA and the platform PCB LGAs.

As shown in a block 802, a first solder reflow process is performed to attach the PM controller and associated circuitry to the interposer using a first solder compound at a first reflow temperature. The first solder reflow process is used during manufacture of the dual type-C port PD module, which is separately manufacture. Generally, the dual type-C port PD module will look something similar to that shown in FIGS. 7a and 7b, noting that the circuit configuration will different, depending on the PD controller that is used.

The second reflow operation in block 804 is used to attach the dual type-C port PD module to the platform PCB by means of the interposer LGA and the platform LGA. In this example, the second reflow operation uses a second solder compound at a second reflow temperature that is lower than the first reflow temperature. The reason for using two different reflow temperature (and two different solder compounds) is to prevent reflow from occurring for the components mounted to the interposer PCB via the first reflow operation. As an alternative, the interposer PCB and attached circuitry may be encapsulated as a package (e.g., using a suitable material), in which case the same solder compound and reflow temperature may be used for both reflow processes.

In one embodiment the interposer PCB is made of an FR-4 material supporting a high glass transition temperature (Tg) to support dual reflow. In one embodiment the Tg is >230° C.

The principles and teachings disclosed herein may be applied to PD solutions for dual USB type-C ports to meet the signal and voltage requirements defined in existing and future standards. For example, the standards include the USB4 specification version 1.0, released Aug. 29, 2019, including support for Thunderbolt™ alternate mode and DPAM.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A dual type-C port power delivery (PD) module, comprising:
   an interposer printed circuit board (PCB) or substrate having PD circuitry electrically coupled thereto, the PD circuitry including a PD controller having a pinout including power signals and input/output (I/O) signals, and circuit elements electrically coupled to the PD controller;
   an interposer land grid array (LGA) comprising a first plurality of pads disposed on the interposer PCB or substrate arranged in a first LGA pattern; and wiring and vias formed in the interposer PCB or substrate to electrically couple pads in the interposer LGA to the PD circuitry, wherein the interposer PCB or substate is configured to be soldered down via the interposer LGA to a platform LGA on a platform PCB having two USB (Universal Serial Bus) type-C ports coupled thereto, the platform LGA comprising a second plurality of pads arranged in a second LGA pattern matching the first LGA pattern, and wherein a pinout of the interposer and platform LGAs comprises a pre-defined generic pinout enabling use of different PD controllers.

2. The dual type-C PD module of claim 1, wherein the pre-defined generic pinout includes signals comprising:
a power interface comprising multiple input voltage signals having different input voltages and ground signals;
a type-C interface comprising a plurality of USB type-C I/O signals in accordance with a USB type-C standard; and
a power path interface comprising a plurality of I/O signals including external sink and source enable path signals for each of a first and second type-C port.

3. The dual type-C PD module of claim 1, wherein the first and second LGA patterns include a plurality of pads disposed proximate to a periphery of the patterns that are used for I/O signals and power signals.

4. The dual type-C PD module of claim 3, wherein the first and second LGA patterns include an array of pads disposed towards a center of the pattern that are used for ground signals.

5. The dual type-C PD module of claim 3, wherein the plurality of pads disposed proximate to the periphery of the patterns include an outer ring of pads disposed adjacent to the periphery of the patterns and an inner ring pads offset from the outer ring of pads.

6. The dual type-C PD module of claim 1, wherein the pre-defined generic pinout includes I/O signals to support a plurality of I2C interfaces.

7. The dual type-C PD module of claim 1, wherein the pre-defined generic pinout includes a high speed controller interface comprising a plurality of high speed controller signals.

8. The dual type-C PD module of claim 1, wherein the pre-defined generic pinout comprises a superset of power signals and I/O signals to interface with multiple different PD controllers, at least one of which employs a subset of the superset of power signals and I/O signals.

9. The dual type-C PD module of claim 1, wherein the interposer is made of a CR-4 material with a glass transition temperature (Tg)>230° C.

10. The dual type-C PD module of claim 1, wherein the interposer PCB or substrate has a square form factor of less than 12×12 millimeters.

11. A platform, comprising:
a dual type-C port power delivery (PD) module, including,
an interposer printed circuit board (PCB) or substrate having power delivery circuitry electrically coupled thereto, the PD circuitry including a PD controller having a pinout including power signals and input/output (I/O) signals, and circuit elements electrically coupled to the PD controller;
an interposer land grid array (LGA) comprising a first plurality of pads disposed on the interposer PCB or substrate arranged in a first LGA pattern; and
wiring and vias formed in the interposer PCB or substrate to electrically couple pads in the interposer LGA to the PD circuitry; and
a platform PCB to which a processor and first and second USB type-C ports are coupled and having a platform LGA comprising a second plurality of pads arranged in a second LGA pattern matching the first LGA pattern, wherein the interposer LGA is soldered down to the platform LGA, and wherein a pinout of the interposer LGA and the platform LGA comprises a pre-defined generic pinout enabling use of different PD controllers.

12. The platform of claim 11, further comprising a battery power source, wherein the PD controller is configured to enable the battery power source to receive power from a power supply coupled to the first or second USB type-C port via a USB type-C cable.

13. The platform of claim 11, wherein the pre-defined generic pinout includes signals comprising:
a power interface comprising multiple input voltage signals having different input voltages and ground signals;
a type-C interface comprising a plurality of USB type-C I/O signals in accordance with a type-C standard; and
a power path interface comprising a plurality of I/O signals including external sink and source enable path signals for each of the first and second type-C ports.

14. The platform of claim 11, wherein the pre-defined generic pinout includes an I2C interface comprising a plurality of I2C I/O signals.

15. The platform of claim 11, wherein the pre-defined generic pinout includes a high speed controller interface comprising a plurality of high speed controller signals.

16. The platform of claim 11, wherein the pre-defined generic pinout comprises a superset of power signals and I/O signals to interface with multiple different PD controllers, and wherein the PD controller employs a subset of the superset of power signals and I/O signals.

17. A method, comprising:
soldering down an interposer land Grid Array (LGA) comprising a first plurality of pads deposited on an interposer printed circuit board (PCB) of a dual type-C port power delivery (PD) module including a PD controller to a platform LGA comprising a second plurality of pads deposited on a platform PCB, wherein the first and second plurality of pads are arranged in matching patterns,
wherein a pinout of the interposer LGA and the platform LGA comprises a pre-defined generic pinout enabling use of PD controllers having different pinouts.

18. The method of claim 17, further comprising:
soldering down the PD controller and associated circuit elements to the interposer PCB or substrate using a first solder reflow process employing a first reflow temperature; and
soldering down the interposer LGA to the platform LGA using a second solder reflow process employing a second reflow temperature that is lower than the first reflow temperature.

19. The method of claim 18, wherein the interposer PCB is made of a FR-4 material with a glass transition temperature (Tg)>230° C.

20. The method of claim 17, further comprising:
patterning the plurality of pads for the interposer LGA on the underside of the interposer PCB;
forming a plurality of solder pads on the topside of the interposer PCB, the plurality of solder pads including solder pads corresponding to a pinout for the PD controller and solder pads to which other circuitry elements of the dual type-C port PD module are to be attached; and forming electrical pathways in the interposer PCB to couple pad in the interposer LGA to the plurality of solder pads, wherein a portion of the pads for the interposer LGA are not coupled to any of the solder pads on the topside of the interposer.

\* \* \* \* \*